United States Patent [19]
Pai

[11] Patent Number: 6,000,126
[45] Date of Patent: Dec. 14, 1999

[54] METHOD AND APPARATUS FOR CONNECTING AREA GRID ARRAYS TO PRINTED WIRE BOARD

[75] Inventor: Deepak Keshay Pai, Burnsville, Minn.

[73] Assignee: General Dynamics Information Systems, Inc., Falls Church, Va.

[21] Appl. No.: 08/627,909

[22] Filed: Mar. 29, 1996

[51] Int. Cl.[6] .............................. H01R 9/00; H01R 43/00; H05K 3/34

[52] U.S. Cl. ................................ 29/840; 29/843; 29/884; 29/423

[58] Field of Search .............................. 29/840, 830, 843, 29/879, 884, 423

[56] References Cited

U.S. PATENT DOCUMENTS

| | | | |
|---|---|---|---|
| 3,808,668 | 5/1974 | Connell | 29/423 |
| 3,904,934 | 9/1975 | Martin | 317/101 D |
| 4,349,862 | 9/1982 | Bajorek et al. | 361/762 |
| 4,528,530 | 7/1985 | Ketchen | 333/246 |
| 4,558,397 | 12/1985 | Olsson | 361/772 |
| 4,628,597 | 12/1986 | Meehan et al. | 29/827 |
| 4,642,889 | 2/1987 | Grabbe | 29/840 |
| 4,811,082 | 3/1989 | Jacobs et al. | 357/80 |
| 4,885,662 | 12/1989 | Batholonew et al. | 361/386 |
| 4,920,074 | 4/1990 | Shimizu et al. | 437/211 |
| 5,001,829 | 3/1991 | Schelhorn | 29/840 |
| 5,062,802 | 11/1991 | Grabbe | 439/72 |
| 5,148,265 | 9/1992 | Khandros et al. | 357/80 |
| 5,148,266 | 9/1992 | Khandros et al. | 357/80 |
| 5,258,330 | 11/1993 | Khandros et al. | 437/209 |
| 5,265,321 | 11/1993 | Nelson et al. | 29/841 |
| 5,281,771 | 1/1994 | Swift et al. | 174/262 |
| 5,281,851 | 1/1994 | Mills et al. | 257/670 |
| 5,283,946 | 2/1994 | Simmons et al. | 29/827 |
| 5,286,926 | 2/1994 | Kimura et al. | 174/250 |
| 5,296,652 | 3/1994 | Miller, Jr. | 174/265 |
| 5,298,686 | 3/1994 | Bourdelaise et al. | 174/254 |
| 5,309,324 | 5/1994 | Herandez | 361/734 |
| 5,326,936 | 7/1994 | Taniuchi et al. | 174/260 |
| 5,364,276 | 11/1994 | Inaska | 439/66 |
| 5,367,124 | 11/1994 | Hoffman et al. | 174/52.4 |
| 5,371,654 | 12/1994 | Beaman et al. | 361/744 |
| 5,455,390 | 10/1995 | DiStefano et al. | 174/262 |
| 5,455,446 | 10/1995 | Suppelsa et al. | 257/467 |
| 5,473,814 | 12/1995 | White | 29/840 |
| 5,474,957 | 12/1995 | Urushima | 437/209 |
| 5,479,694 | 1/1996 | Baldwin | 29/840 X |
| 5,484,964 | 1/1996 | Dawson et al. | 174/261 |
| 5,504,652 | 4/1996 | Foster et al. | 361/704 |
| 5,545,281 | 8/1996 | Matsui et al. | 29/840 X |
| 5,551,148 | 9/1996 | Kazui et al. | 29/843 |
| 5,625,944 | 5/1997 | Werther | 29/843 |
| 5,626,278 | 5/1997 | Tang | 29/843 X |
| 5,659,952 | 8/1997 | Kovac et al. | 29/840 |
| 5,675,889 | 10/1997 | Acocella et al. | 29/830 |
| 5,724,728 | 3/1998 | Bond et al. | 29/840 |
| 5,802,712 | 9/1998 | Sakai et al. | 29/840 |
| 5,829,128 | 11/1998 | Eldridge et al. | 29/840 X |
| 5,832,601 | 11/1998 | Eldridge et al. | 29/843 |

Primary Examiner—Rinaldi I. Rada
Assistant Examiner—T. Anthony Vaughn
Attorney, Agent, or Firm—Kinney & Lange, P.A.

[57] ABSTRACT

A method and apparatus is provided for connecting area grid array semiconductor chips to a printed wire board. A compliant lead matrix includes a carrier and a plurality of conductive leads arranged parallel to one another and secured relative to the carrier in the form of a matrix. The method includes orienting a first side of the lead matrix to be aligned with a reciprocal matrix of conductive surface pads on the area grid array semiconductor chip. First ends of the leads are electrically connected to the conductive surface pads of the area grid array chip. The second side of the lead matrix is oriented to be aligned with a reciprocal matrix of conductive surface pads on a printed wire board. Second ends of the leads of the lead matrix are electrically connected to the conductive surface pads of the printed wire board thereby establishing an electrical connection between the area grid array chip and the printed wire board.

20 Claims, 6 Drawing Sheets

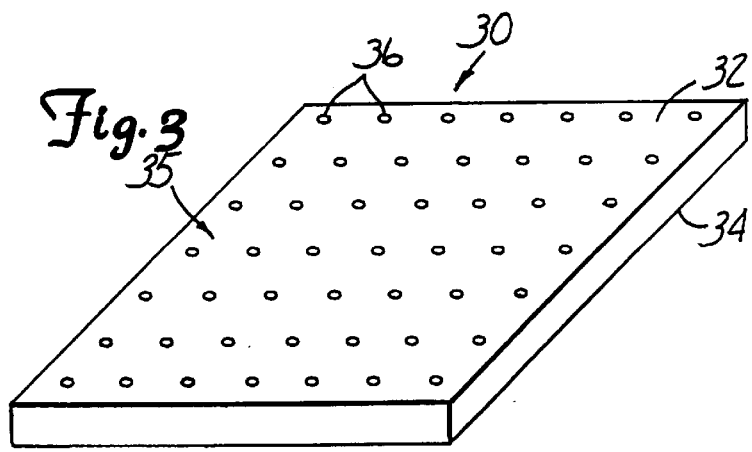
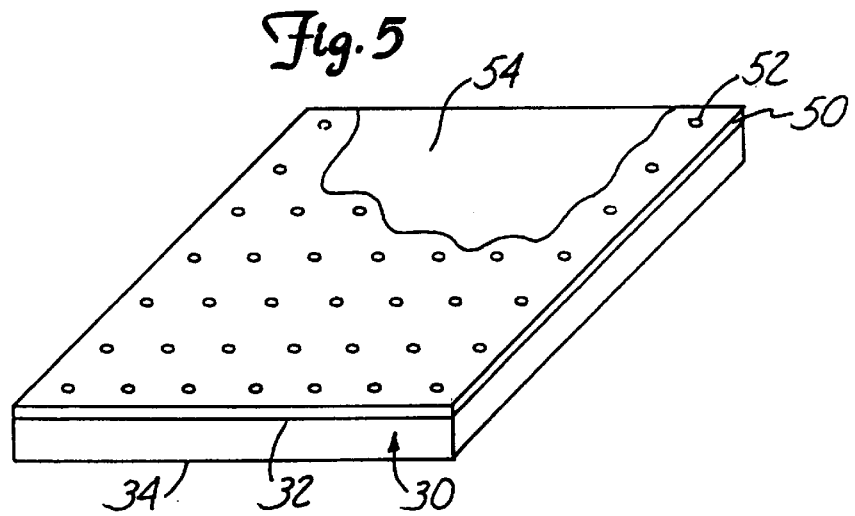
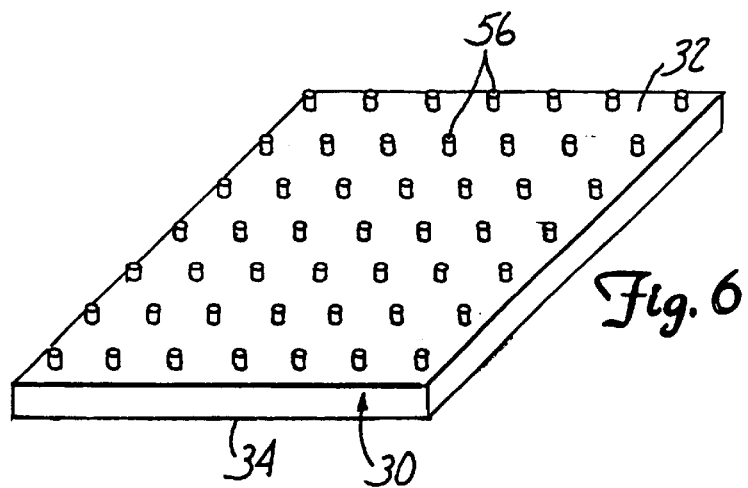

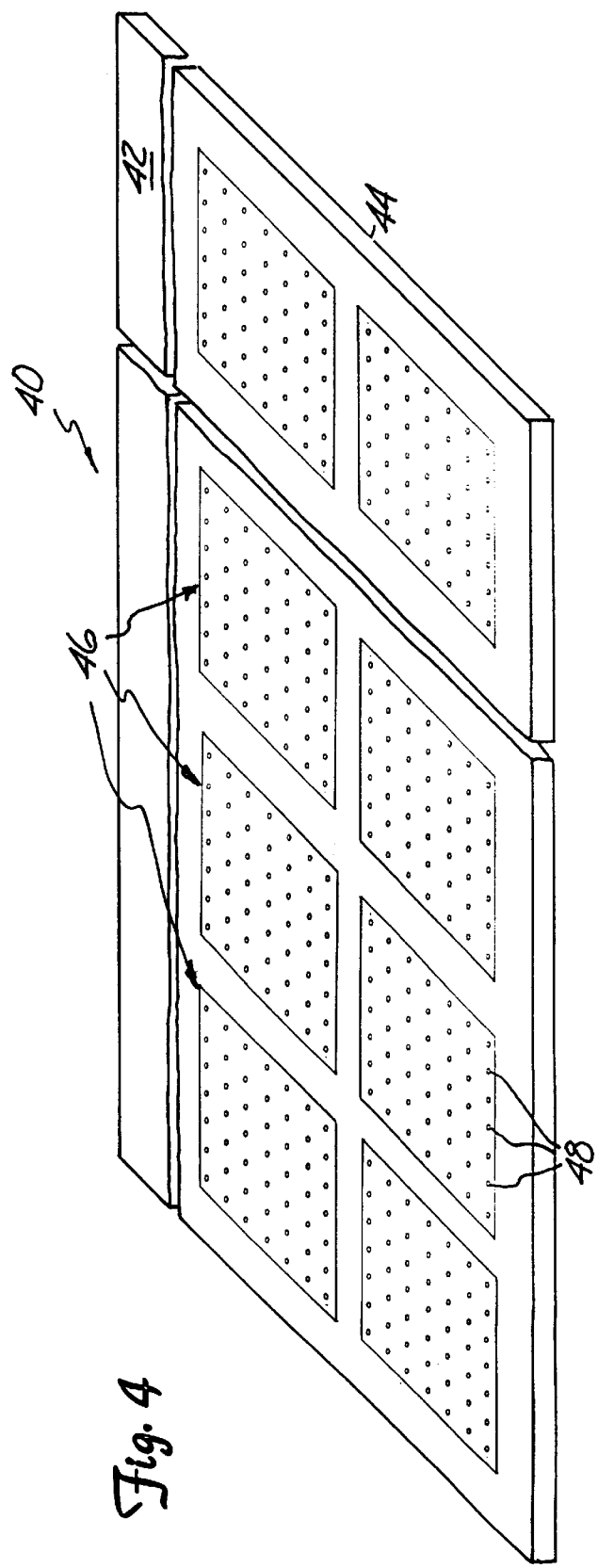

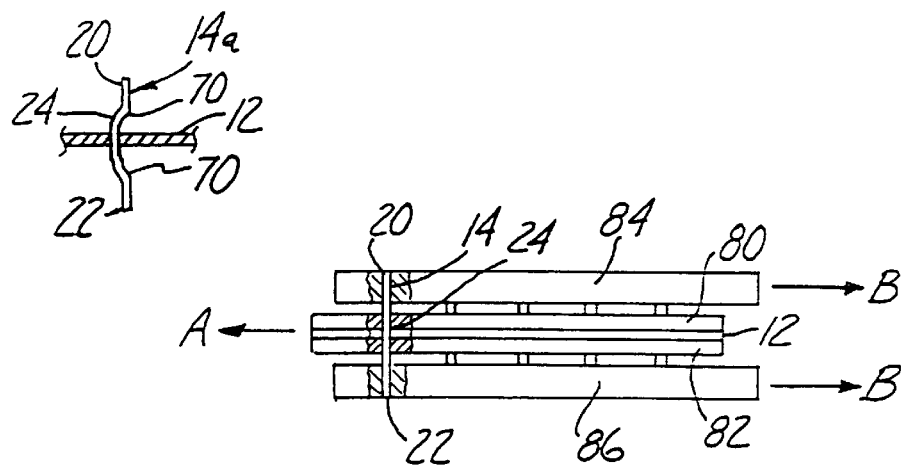
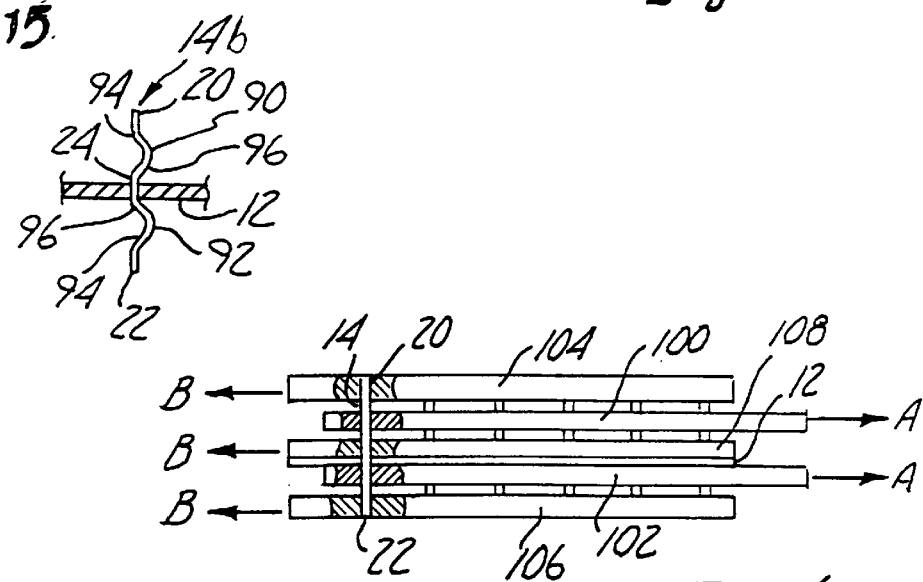
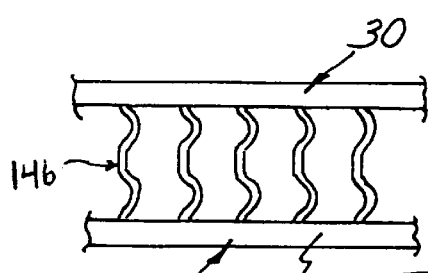
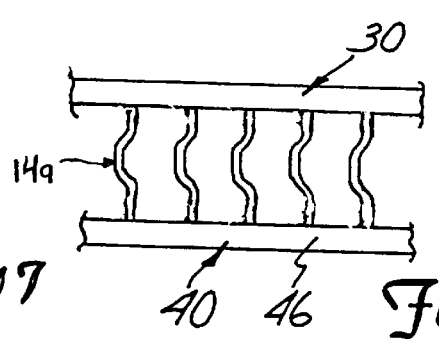

METHOD AND APPARATUS FOR CONNECTING AREA GRID ARRAYS TO PRINTED WIRE BOARD

BACKGROUND OF THE INVENTION

The present invention relates to mounting and connection devices and in particular mounting and connecting microelectronic units such as semiconductor chips on printed wire boards.

Early methods of mounting and connecting semiconductor chips to printed wire boards frequently resulted in unreliable connections. Specifically, the early methods provided an electrical connection between a semiconductor chip and a printed wire board that consisted of a solder joint. This type of connection was suitable for normal environments, such as a desk top use. However, boards also can be used in other environments subjecting the board and chip to vibrations and temperature changes. The vibrations frequently caused fatigue failures in the solder joints. Temperature changes also caused connection failures due to the difference in the thermal coefficient of expansion for the semiconductor chips and the printed wire board. For example, the printed wire boards frequently have a thermal coefficient of expansion (for example, $18 \times 10^{-6}$ inch/inch ° C.) that is about three times greater than the thermal coefficient of expansion for the semiconductor chips (for example, $6 \times 10^{-6}$ inch/inch ° C.). Accordingly, when the chip mounted board was subject to temperature changes, the difference in the thermal coefficient of expansion between the semiconductor chip and printed wire board would exert strain on the solder joint therebetween ultimately resulting in a broken connection between the chip and the printed wire board.

Further improvements in connecting semiconductor chips to printed wire boards were developed to solve this problem. Specifically, the semiconductor chips were configured to have leads arranged about the periphery or border of the chip. This configuration is known as a peripheral grid array (PGA) chip. To overcome the problems caused by the differing thermal coefficient of expansion between the PGA chips and the printed wire boards, the leads on the chip were formed into an S-shape so that the lead could compensate for the differing thermal coefficients of expansion for the PGA chip and the printed wire board during temperature changes or vibration. See U.S. Pat. No. 4,827,611, U.S. Pat. No. 5,294,039, and U.S. Pat. No. 5,317,479.

However, because of the drive to miniaturize semiconductor chip and printed wire board assemblies, the S-shaped lead left too much space between the surface of the printed wire board and the semiconductor chip. Accordingly, a C-shaped lead was developed to reduce the spacing between the surface of the chip and the printed wire board thereby yielding a mounted chip with a lower profile than with a S-shaped lead. The shape of the C-lead however, still allowed the lead to compensate for the differing thermal coefficients of expansion of the chip and printed wire board during temperature changes and vibrations.

The C-shaped lead and the S-shaped lead were sufficient to deal with the problem of differing thermal coefficients of expansion between the PGA semiconductor chips and the printed wire board until the advent of area grid array (AGA) semiconductor chips. With area grid array (AGA) chips, the conductive connecting surface pads of the chip are arranged in a matrix or an array that is connected to a reciprocal matrix of connecting surfaces on the printed wire board. These AGA chips are connected to the printed wire board matrix by solder joints shaped in the form of solder balls resulting the AGA chips sometimes being referred to as ball grid arrays (BGA). These solder balls or spheres are typically made from conventional solder (63 weight percent tin and 37 weight percent lead, 10 weight percent tin and 90 weight percent lead, or an equivalent alloy). However, like the original semiconductor solder joints, these solder ball joints connecting AGA chips to the printed wire board are not very reliable under temperature changes or mechanical stresses like vibrations. Moreover, once an AGA chip is mounted on a printed wire board, it is difficult to access a connection point between a single conductive pad on the AGA chip and a reciprocal conductive pad on the printed wire board. Accordingly, with a solder ball joint failure, the entire AGA chip must be removed from the printed wire board to correct the bad connection. While AGA chips permit further miniaturization of printed wire boards by consolidating the space required to connect the chips to the board, the reliability problems associated with solder joints between semiconductor chips and printed wire boards resurfaced.

One attempted solution includes the use of solder columns instead of solder ball spheres. The solder columns are typically made of solder alloy having a composition of 10 weight percent tin and 90 weight percent lead. However, solder columns do not provide improved strength or reliability over solder balls. In addition, the high lead content of this solder alloy is highly undesirable because of heavy environmental pressures to avoid introducing additional lead into the environment.

Finally, some attempts have been made to use a conductive lead to connect an AGA chip to a printed wire board. For example, U.S. Pat. No. 5,455,390 discloses a method for placing a plurality of conductive connecting leads between the conductive surface pads of the AGA chip and the connecting surface pads of the printed wire board. However, this method still results in connection failures due to the less reliable type of material (e.g., gold) used to make the conductive connecting leads.

SUMMARY OF THE INVENTION

A method of the present invention interconnects area grid array chips to a printed wire board. The method includes orienting a first side of a matrix of a plurality of conductive leads, secured relative to one another in parallel by an insulating carrier, so that the first ends of the matrix are aligned with a reciprocating matrix of conductive surface pads on an area grid array chip. The leads are electrically connected to the connecting surfaces of the area grid array chip. Next, the second side of the matrix of leads are oriented so that their second ends are aligned with a reciprocating matrix of connecting surface pads on a printed wire board. The leads of the second side of the lead matrix are electrically connected to the connecting surface pads of the printed wire board thereby establishing an electrical connection between the area grid array and the printed wire board.

BRIEF DESCRIPTION OF THE DRAWINGS

FIG. 3 is an isometric view of an area grid array semiconductor chip.

FIG. 4 is an isometric view of a printed wire board having a plurality of connecting surfaces arranged thereon.

FIG. 5 is an isometric view of an area grid array chip with a stencil and solder pasted applied thereon.

FIG. 6 is an isometric view of a plurality of solder posts extending from a surface of an area grid array chip.

FIG. 13 is a side view of a single bow-shaped lead of the compliant lead matrix.

FIG. 14 is a side view in elevation of a method of shaping the leads of the compliant lead matrix.

FIG. 15 is a side view of a double bow-shaped lead of the compliant lead matrix.

FIG. 16 is a side view in elevation of an alternative method of shaping the leads of the compliant lead matrix.

FIG. 17 is a side view of a compliant lead matrix with double bow shaped leads electrically connecting a printed wire board and an area grid array (with an insulating layer of the lead matrix removed).

FIG. 18 is a side view of a compliant lead matrix with single bow shaped leads electrically connecting a printed wire board and an area grid array (with an insulating layer of the lead matrix removed).

DETAILED DESCRIPTION OF THE PREFERRED EMBODIMENTS

Figure 1:
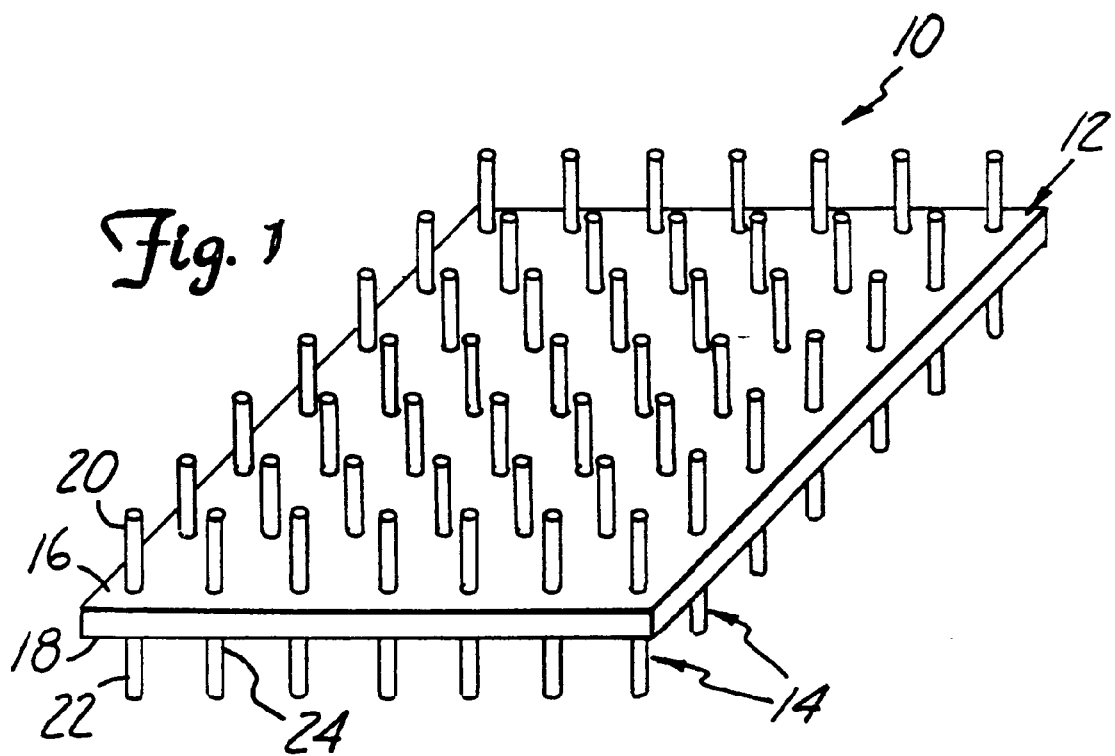
FIG. 1 is an isometric view of a compliant lead matrix of the present invention.
Figure 2:
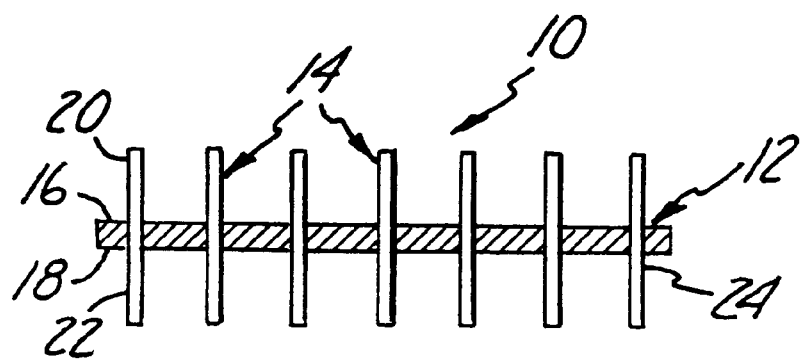
FIG. 2 is a sectional view of FIG. 1.

A compliant lead matrix of the present invention is illustrated generally in FIGS. 1–2 at 10. The lead matrix 10 includes an insulating carrier 12 and a plurality of leads 14. The insulating carrier 12 has a first side 16, a second side 18, and a plurality of holes 19 formed therein. Each lead 14 includes a first end 20, a second end 22, and a midportion 24.

The leads 14 are made of an electrically conductive flexible material such as copper. The leads 14 are preferably formed in cylindrical or rectangular shapes and are preferably plated with tin, a nickel-silver alloy or a tin-lead alloy. The leads 14 preferably have a length between 50 to 100 millimeters with 80 millimeters being a preferred length. The leads 14 preferably have a diameter of about 0.010 to 0.012 inches.

The insulating carrier 12 is made of nonconductive material preferably including any one of the following materials: polyimide, ceramic material, BT, and FR4. The materials sold under the tradename BT and FR4 are well known to those skilled in the art and are available from sources such as DuPont Company of Wilmington, Del., Rogers of the State of Colorado, or Hitachi of Japan. The insulating carrier 12 preferably is a laminate of materials such as a laminate of one layer of BT and one layer of FR4 bonded together. In addition, the insulating material can be made of a water soluble material such as cardboard. The insulating carrier 12 preferably has a thickness of about 0.005 to 0.060 inches. A matrix of holes 19 in the carrier 12 for receiving lead 14 is created by drilling the holes in the insulating carrier material. The holes 19 are preferably spaced apart by a distance of about 0.050 inches.

The leads 14 are preferably formed and then mounted in the matrix of holes 19 of the insulating carrier 12. The leads 14 are aligned in parallel to one another and perpendicular to the insulating carrier 12. The leads 14 are arranged relative to the insulating carrier 12 so that the first ends 20 and the second ends 22 of the leads 14 are substantially equidistant from the insulating carrier 12 as shown in FIG. 2. Alternatively, the leads 14 can be arranged in the insulating carrier 12 so that the first end 20 of the leads and the second end 22 of the leads 14 are not equidistant from the insulating carrier 12. Finally, the leads 14 preferably are arranged so that the each of the first ends 20 of the leads 14 are coplanar relative to each other and each of the second ends 22 of the leads 14 are coplanar relative to each other.

An area grid array (AGA) semiconductor chip 30 is shown in FIG. 3. The AGA chip 30 includes a first connecting surface 32, a second surface 34 and a matrix of conductive connecting surface pads 36 on the first surface 32. The AGA chip 30 is a conventional semiconductor chip housing microelectronic circuitry which has input and output connections made available via the connecting surface pads 36.

The AGA chip 30 is provided for mounting and connection on a printed wire board 40 such as shown in FIG. 4. The printed wire board 40 has a first surface 42, a second surface 44, and an array of connection surfaces 46. Each connection surface 46 is capable of receiving an AGA chip 30. Accordingly, a plurality of AGA chips 30 can be mounted and connected to the printed wire board 40. Each connection surface 46 includes an array of conductive connecting surface pads 48 sized and arranged to electrically mate with an array of conductive connecting surface pads of an AGA chip.

The following method is used to interconnect the AGA chip 30 to the printed wire board 40 using the compliant lead matrix 10 of the present invention. First, a solder paste is applied to the first surface 32 of the AGA chip 30 to form solders posts on the conductive surface pads 36. Specifically, a first stencil 50 is provided that has a matrix of holes 52 that matches the matrix of surface pads 36 on the AGA chip 30. As shown in FIG. 5, the first stencil 50 is overlayed on the AGA chip 30 with the stencil holes 52 being aligned over the surface pads 36 of the AGA chip. Next, a solder paste 54 is applied over the first stencil 50 so that the solder paste 54 fills the holes 52 and bonds onto the surface pads 36 of the AGA chip 30. Once the solder paste 54 has solidified, the first stencil 50 is removed leaving the AGA chip 30 with a matrix of solder posts 56 extending upwardly from the connecting surface pads 36 of the AGA chip 30, as shown in FIG. 6. The AGA chip 30 is now prepared to be connected to the compliant lead matrix 10.

Figure 7:
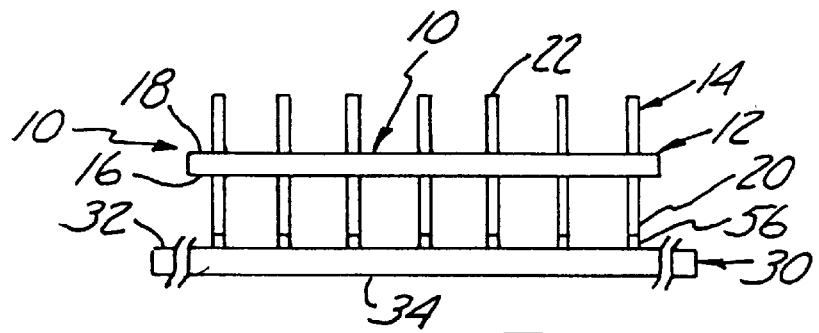
FIG. 7 is a side view in elevation of a compliant lead matrix aligned with solder posts on an area grid array chip.

As shown in FIG. 7, the AGA chip 30 is oriented so that its first connecting surface 32 is facing upward and the lead matrix 10 is oriented relative to the AGA chip 30 so that the first end 20 of each lead 14 is aligned with a respective one of the solder posts 56, in an end to end relationship. While in this position, a hot air gas flow or other means is used to cause the solder posts 56 to reflow establishing an electrical connection between the connecting surface pads 36 of the AGA chip 30 and the first ends 20 of the leads 14 of the lead matrix 10.

Figure 8:
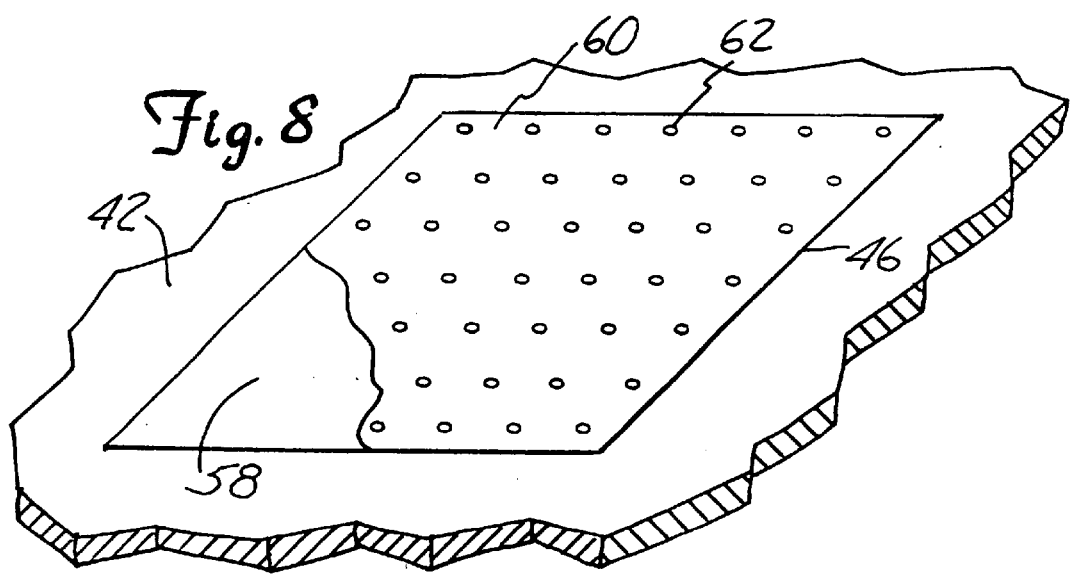
FIG. 8 is a partial perspective view of a printed wire board with a stencil and solder paste applied thereon.
Figure 9:
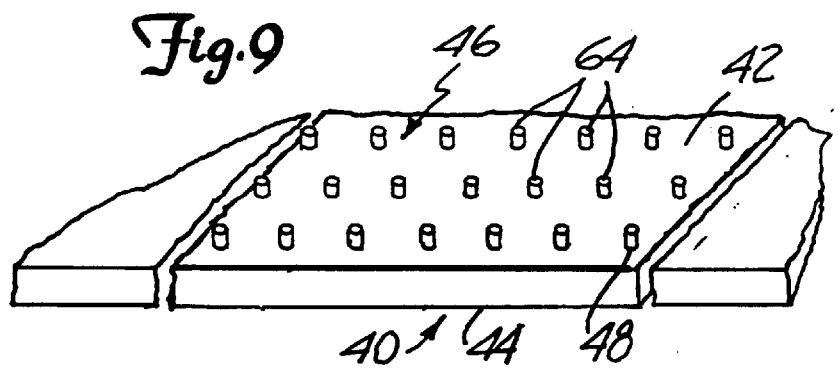
FIG. 9 is a partial sectional view of a plurality of solder posts extending from the connecting surface of the printed wire board.

Next, a solder paste is applied to the first surface 42 of the printed wire board 40 to form solders posts on the conductive surface pads 48. Specifically, a second stencil 60 is provided that has a matrix of holes 62 that matches the matrix of surface pads 48 on the printed wire board 40. The second stencil 60 is overlayed on the printed wire board 40 with the stencil holes 62 being aligned over the surface pads 48 of the printed wire board, as shown in FIG. 8. Next, solder paste 58 is applied over the second stencil 60 so that the solder paste 58 fills the holes 62 and bonds onto the surface pads 48 of the printed wire board 40. Once the solder paste 58 has solidified, the second stencil 60 is removed, leaving the printed wire board 40 with a matrix of solder posts 64 extending upwardly from the connecting surface pads 48, as shown in FIG. 9. The printed wire board 40 is now prepared to be connected to the compliant lead matrix 10.

Figure 10:
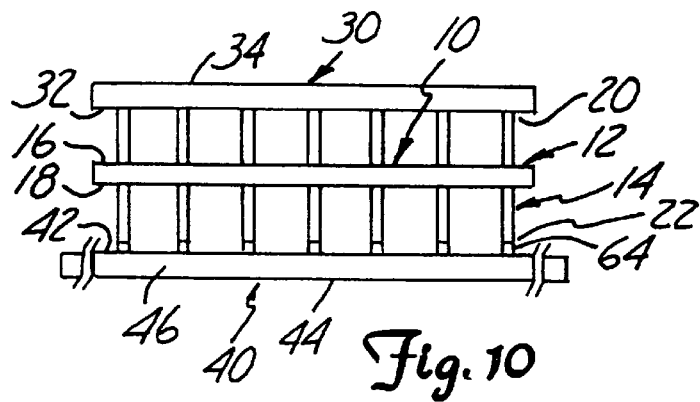
FIG. 10 is a side view of a second side of a compliant lead matrix aligned with a plurality of solder posts on a printed wire board.

As shown in FIG. 10, the printed wire board 40 is oriented so that its first connecting surface 42 is facing upward. Next, the lead matrix 10 is oriented relative to the printed wire board 40 so that the second end 22 of each lead 14 is aligned with a respective one of the solder posts 62, in an end to end relationship. While in this position, a hot air gas flow or other means is used to cause the solder to reflow establishing an electrical connection between the connecting surface pads 48 of the printed wire board 40 and the second ends 22 of the leads 14 of the lead matrix 10.

Figure 11:
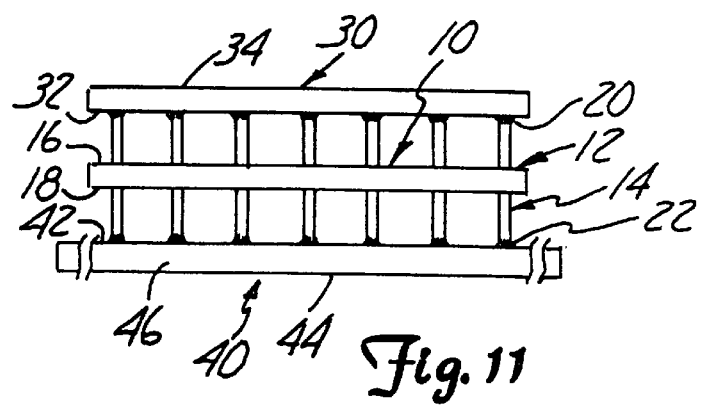
FIG. 11 is a side view of a printed wire board and an area grid array chip electrically connected by a compliant lead matrix.

This connection establishes an electrical connection between the AGA chip 30 and the printed wire board 40 via lead matrix 10, as shown in FIG. 11. The compliant lead matrix 10 provides a high strength connection that is about five to seven times stronger than conventional lead connections (e.g., gold leads having a diameter of about 2 millimeters) between an AGA chip and a printed wire board.

Means in addition to the compliant lead matrix can be employed to enhance the strength and reliability of electrical connection between an area grid array chip and a printed wire board. Specifically, in a preferred embodiment of the present invention the solder paste applied to the AGA chip for connecting the AGA chip to the leads of the lead matrix is a lead-free solder. This lead-free solder preferably is a composition of tin and silver. In one embodiment, the lead-free solder has a composition of 96 percent by weight of tin and 3 percent by weight of silver. This lead-free solder has a higher melting temperature than conventional solder (63 weight percent tin and 37 weight percent lead) and therefore provides a reliable electrical connection under highly elevated temperature conditions. In addition, this lead free solder is stronger than conventional solder having the capability to better survive mechanical vibrations and the effects of differing thermal coefficients of expansion between an AGA chip and a printed wire board. All of these advantages of lead-free solder further accentuate the advantages of increased reliability and strength provided by the compliant lead matrix 10.

Using lead-free solder makes trouble shooting for poor electrical connections or other failures easier since the lead-free solder is much less likely to fail than other connections made with conventional solder, thereby effectively reducing the number of likely failure sites. Using lead-free solder also reduces problems associated with reflow of solder between the AGA chip and the lead matrix 10 (that would otherwise occur when conventional solder is used at that connection site) when the conventional solder between the lead matrix and printed wire board is reflowed. Finally, lead-free solder is environmentally friendly reducing the introduction of additional lead in the environment.

Figure 12:
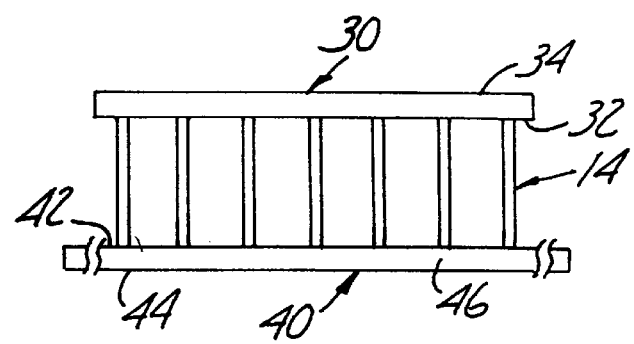
FIG. 12 is a side view of a printed wire board and an area grid array chip electrically connected by a compliant lead matrix (with an insulating carrier of the lead matrix removed).

Once the electrical connection has been made between the AGA chip 30 and the printed wire board 40, the insulating carrier 12 of the lead matrix 10 can be removed. This can be readily accomplished when the insulating carrier 12 is made of a water soluble material such as cardboard. Water or some other suitable fluid is applied to the lead matrix 10 to dissolve the insulating carrier 12 thereby leaving only the leads 14 of the matrix 10 as shown in FIG. 12. This removal step can remove extra weight from the assembly of the AGA chip 30 and printed wire board 40 and can simplify any subsequent rework procedures if the AGA chip 30 needs to be replaced or another type of chip is substituted for the original AGA chip 30.

The leads 14 of the lead matrix shown in FIGS. 1–12 are relatively straight. However, the leads can have a nonlinear shape (as shown in FIGS. 13 and 15) to provide additional strain relief in the connection between the AGA chip 30 and the printed wire board 40. As shown in FIG. 13, the leads 14a have a bow-curved shape in which the first end 20 of the lead 14a is in alignment with the second end 22 of the lead 14a but the first and second ends 20 and 22 are offset from the midportion 24 of the lead 14a. A curve 70 forms a transition between the first end 20 and the midportion 24 and a curve 71 forms a transition between the second end 22 and the midportion 24. To form the leads 14a in the shape shown in FIG. 13, two pairs of supports are provided (as shown in FIG. 14): an inner pair defined by a first support 80 and a second support 82, and an outer pair defined by a third support 84 and a fourth support 86. The supports are configured and arranged substantially similar to the insulating carrier 12 and are made of steel. Each support 80, 82, 84 and 86 has a matrix of holes formed therein, and the matrixes are aligned to match the matrix alignment of the matrix of leads 14a.

After a complaint lead matrix assembly has been formed such as shown in FIGS. 1 and 2, the first support 80 is fit over the first ends 20 of the leads 14 of the lead matrix 10 and positioned immediately adjacent the insulating carrier 12 while the second support 82 is fit over the second ends 22 of the leads 14a and positioned immediately adjacent the insulating carrier 12 opposite the first support 80. Next, the third support 84 is releasably secured onto the first ends 20 of the leads 14a and the fourth support 86 is releasably secured onto the second ends 22 of the leads 14a. The insulating carrier 12, the first support 80, and second support 82 are then urged in a first direction (A) while the third support 84 and the fourth support 86 are urged in a second direction (B), opposite the first direction. The supports 80, 82, 84, and 86 are moved relative to one another for a distance sufficient to bend the leads 14a into the shape shown in FIG. 13 and then removed from the leads 14a of the lead matrix 10. The leads 14a are sufficiently resilient such that the steel supports (80, 82, 84 and 86) can be removed from the leads 14a without permanently altering the desired shape of the leads 14a shown in FIG. 13.

The single bow shape lead 14a provides additional strain relief for the combined mechanical and electrical connection between the AGA chip 30 and the printed wire board 40. The bow shape of the lead 14a permits some movement of the AGA chip 30 relative to the printed wire board 40 without resulting in a failure of the electrical and mechanical connection therebetween whereas a connection formed purely from solder allows no degree of relative movement and a connection formed of a lead 14 of the matrix 10 permits little relative movement between the AGA chip and the printed wire board 40. This additional strain relief can be particularly important when the AGA chip and printed wire board assembly is subject to harsh environmental conditions such as vigorous mechanical vibrations or large temperature changes.

Another alternate embodiment is shown in FIG. 15. In this case, the leads 14b have a double bow-curved shape, in which the first ends 20 of the leads 14b are in alignment with the second ends 22 of the leads 14b and both the first and second ends 20 and 22 are in alignment with the midportions 24 of the leads 14b. In addition, a first intermediate portion 90 and a second intermediate portion 92 of the leads 14 are in alignment with each other but are offset from the first and second ends 20 and 22 and the midportion 24. A first curve 94 forms the transition between the first end 20 and the first intermediate portion 90 of the lead and a second curve 95 forms a transition between the second end 22 and the second intermediate portion 92. A third curve 96 forms the transition between the first intermediate portion 90 and the midportion 24 and a fourth curve 97 forms a transition between the second intermediate portion 92 and the midportion 24.

To form the leads 14 in the shape shown in FIG. 15, two pairs of supports are again provided, along with a medial support (as shown in FIG. 16). An inner pair is defined by a fifth support 100 and a sixth support 102, while an outer pair is defined by a seventh support 104 and an eighth support 106. A medial support 108 is aligned between the other supports and adjacent the insulating carrier 12. The supports are configured and arranged substantially similar to the insulating carrier 12 and are preferably made of steel. Each support 100, 102, 104, 106, and 108 has a matrix of holes formed therein, and the matrixes are aligned to match the matrix alignment of the matrix of leads 14b.

After a compliant lead matrix assembly has been formed such as shown in FIGS. 1 and 2, the medial support 108 is slid over the matrix of leads 14b so that the support 108 is releasably secured on the midportion 24 of the leads 14b immediately adjacent the insulating carrier 12 (either next to the first surface 16 or the second surface 18 of the insulating carrier 12). The fifth support 100 is then releasably secured onto the first intermediate portion 90 of the leads 14b and the sixth support 102 is releasably secured onto the second intermediate portion 92 of the leads 14b. Next, the seventh support 104 is releasably secured on the first ends 20 of the leads and the eighth support 106 is releasably secured onto the second ends 22 of the leads 14b. Then, the fifth support 100 and the sixth support 102 are urged in a first direction (A) while the seventh support 104 and eighth support 106 (along with the insulating carrier 12 and the medial support 108) are urged in a second direction (B), opposite the first direction. The supports 100, 102, 104, 106 and 108 are moved relative to one another for a distance sufficient to bend the leads 14b into the shape shown in FIG. 15 and then removed from the leads 14 of the lead matrix 10. The leads 14b are sufficiently resilient such that the steel supports (100, 102, 104, 106 and 108) can be removed from the leads 14b without permanently altering the desired shape of the leads 14b shown in FIG. 15.

Similar to the single bow shape lead 14a, the double bow shape lead 14b provides additional strain relief under harsh environmental conditions that would typically cause failure of a conventional solder connection. The double bow lead 14b, however, has two curved portions so that the double bow shape provides even more strain relief than the single bow lead 14a.

FIG. 17 illustrates an area grid array chip 30 connected to a printed wire board 40 using a compliant lead matrix 10 having a double bow shape lead 14b of the type shown in FIG. 15. Alternatively, a compliant lead matrix having a single bow shape lead of the type shown in FIG. 13 could be used in place of the double bow lead as shown in FIG. 18.

The method and apparatus of the present invention has several advantages and features. First, the compliant lead matrix establishes a robust electrical connection between an area grid array semiconductor chip and a printed wire board. The leads compensate for the differing thermal coefficients of expansion between the area grid array chip and the printed wire board when the assembly is subject to temperature changes and mechanical stresses such as vibrations. The bow shaped lead and double bow shaped lead in the compliant lead matrix accentuate this compensating feature since the bow and double bow shapes provide additional strain relief. The increased reliability provided by the compliant lead matrix of the present invention can be further accentuated by using lead-free solder to form the electrical connection between an area grid array chip and the compliant lead matrix. In sum, the lead matrix of the present invention provides a convenient manner of establishing both a reliable electrical and a robust mechanical connection between a microelectronic component such as an area grid array chip and a printed wire board.

Although the present invention has been described with reference to preferred embodiments, workers skilled in the art will recognize that changes may be made in form and detail without departing from the spirit and scope of the invention.

What is claimed is:

1. A method of connecting an area grid array semiconductor chip to a printed wire board comprising:

providing a matrix of a plurality of conductive leads secured relative to one another in parallel by a carrier, the leads being aligned with a longitudinal axis of the leads being perpendicular to a plane of the carrier, each lead having a body having first and second ends exposed to opposite sides of the carrier such that the first end is distal from the carrier, the body further having an intermediate portion between the carrier and the first end not in alignment with the longitudinal axis;

orienting a first side of the lead matrix so that respective ones of the first and second ends of the leads are aligned with a reciprocal matrix of conductive surface pads on the area grid array semiconductor chip;

electrically connecting the conductive surface pads of the area grid array semiconductor chip to the respective first or second ends of the leads of the lead matrix;

orienting a second side of the lead matrix so that respective ones of the first and second ends of the leads are aligned with a reciprocal matrix of conductive surface pads of the printed wire board; and electrically connecting the conductive surface pads of the printed wire board to the respective first or second ends of the leads of the lead matrix thereby establishing an electrical connection between the area grid array semiconductor chip and the printed wire board, the lead bodies defining a space between the carrier and the chip or board to which the first ends of the leads are connected, the space containing the intermediate portions of the lead bodies.

2. A method of connecting an area grid array chip to a printed wire board comprising:

providing a compliant lead matrix including a carrier and a plurality of conductive leads, the leads having bodies and the carrier having a matrix of holes formed therein and a first side and a second side with the bodies being mounted in the holes of the carrier so that respective first and second ends of each lead are exposed to the respective first and second sides of the carrier, the leads being aligned in parallel with a longitudinal axis of the leads being perpendicular to a plane defined by the carrier, each lead having an intermediate portion exposed to at least one side of the carrier between the carrier and a respective first or second end such that the respective first or second end is distal from the carrier, the intermediate portion not being in alignment with the longitudinal axis;

applying solder paste to a matrix of conductive pads of the area grid array chip to form solder posts extending upward from each of the conductive surface pads of the area grid array chip;

orienting the first ends of the leads on the first side of the carrier of the compliant lead matrix to be aligned with the solder posts on the area grid array chip so that the leads and the solder posts are arranged in an end to end relationship;

applying a hot gas flow to the area grid array chip and the compliant lead matrix to cause reflow of the solder posts with the leads of the compliant lead matrix thereby producing an electrical connection between the leads and the conductive surface pads of the area grid array chip;

applying a solder paste to a matrix of conductive surface pads of the printed wire board to form solder posts extending upward from each of the conductive surface pads of the matrix of the printed wire board;

orienting the second ends of the leads on the second side of the carrier of the compliant lead matrix to be aligned with the solder posts on the printed wire board so that the leads and the solder posts are arranged in an end to end relationship; and applying a hot gas flow to the printed wire board and compliant lead matrix to cause reflow of the solder posts on the printed wire board with the ends of the leads on the second side of the compliant lead matrix thereby producing an electrical connection between the area grid array chip and the printed wire board, the intermediate portions of the lead bodies being in a space between the carrier and the chip or board to which the distal ends of the leads are connected.

3. The method of claim 2 and further comprising the step of:

after the second applying step, dissolving the carrier of the compliant lead matrix.

4. The method of claim 2 wherein the step of applying solder paste to the connecting surface of the area grid array chip further comprises:

overlaying a stencil having a matrix of holes onto the area grid array chip prior to applying solder paste to match the holes of the stencil with the connecting surface pads of the area grid array chip;

removing the stencil from the connecting surface of the area grid array chip after applying the solder paste so that solder posts remain extending upward from the connecting surface pads of the area grid array chip.

5. The method of claim 2 wherein the step of providing a lead matrix further comprises:

overlaying a first support having a matrix of holes over the ends of the leads on the first side of the lead matrix so that the first support is releasably secured to the midportion of the leads on the first side of the matrix;

overlaying a second support having a matrix of holes onto the ends of the leads on the first side of the lead matrix so that the first support is releasably secured to the ends of the leads on the first side of the matrix;

overlaying a third support having a matrix of holes onto the ends of the leads of the second side of the lead matrix so that the second support is releasably secured to the ends of the second side of the leads; and pulling the first support and the carrier in a first direction while pulling the second and third supports in a second direction opposite the first direction to bend the leads so that the ends of the lead are not in alignment with the mid portion of the lead thereby forming the lead into the shape of a single bow; and removing the first, second, and third supports from the leads of the matrix.

6. The method of claim 2 wherein the step of applying solder paste to the connecting surface of the printed wire board further comprises:

overlaying a stencil having a matrix of holes onto the printed wire board prior to applying solder paste to match the holes of the stencil with the connecting surface pads of the printed wire board;

removing the stencil from the connecting surface of the printed wire board after applying the solder paste so that solder posts remain extending upward from the connecting surface pads of the printed wire board.

7. A method of making a compliant lead matrix comprising:

inserting a plurality of conductive leads into a plurality of holes in a carrier so that the leads extend through the carrier to have ends of the leads exposed on each of first and second sides of the carrier, the leads aligned in parallel with a longitudinal axis of the leads being perpendicular to a plane defined by the carrier;

overlaying a first support having a matrix of holes over the leads on the first side of the lead matrix so that the first support is releasably secured to a midportion of the leads on the first side of the lead matrix;

overlaying a second support having a matrix of holes onto the leads on the first side of the lead matrix so that the first support is releasably secured to the leads on the first side of the lead matrix;

overlaying a third support having a matrix of holes onto the leads of the second side of the lead matrix so that the second support is releasably secured to the second side of the leads; and pulling the first support and the carrier in a first direction while pulling the second and third supports in a second direction opposite the first direction to bend the leads so that portions of the leads on each side of the carrier are not in alignment with the midportion of the lead; and removing the first, second, and third supports from the leads of the lead matrix.

8. A method of claim 7 wherein the second and third supports are releasably secured to intermediate portions of the leads between the midportion and respective ends of the leads on respective first and second sides of the lead matrix, the method further including:

overlaying a fourth support with a matrix of holes therein over the leads of the first side of the lead matrix so that the fourth support is releasably secured to the ends of the leads on the first side of the lead matrix;

overlaying a fifth support with a matrix of holes therein over the leads of the second side of the lead matrix so that the fifth support is releasably secured to the ends of the leads on the second side of the lead matrix;

wherein the step of pulling includes pulling the fourth and fifth supports in the first direction with the carrier and first support while pulling the second and third supports in the second direction to bend the leads so that the ends of the lead are in alignment with the midportion of the lead while the intermediate portion of the leads are not in alignment with the ends and the midportion of the leads thereby forming the lead into the shape of a double bow; and removing the first, second, third, fourth and fifth supports from the ends of the leads.

9. The method of claim 7 wherein the second and third supports are releasably secured to respective ends of the leads on respective first and second sides of the lead matrix, and the step of pulling bends the ends of the leads to form each lead into the shape of a single bow.

10. A compliant lead matrix for connecting area grid arrays to printed wire boards comprising:

a carrier having first and second sides and a plurality of holes therein arranged in a matrix; and a plurality of compliant conductive leads each having a body extending through and secured in the holes of the carrier so that ends of the leads are exposed on each of the first and second sides of the carrier with at least one of the ends being distal from the carrier, the leads being aligned in parallel with a longitudinal axis of the leads being perpendicular to a plane defined by the carrier, the body of each lead having at least one intermediate portion between the carrier and the one end, the intermediate portion not being in alignment with the longitudinal axis, the intermediate portion of each lead body being compliant.

11. The compliant lead matrix of claim 10 wherein the leads of the matrix are shaped so that the ends of each lead extend parallel to a midportion of the lead with the intermediate portion being between the midpoint and the at least one end of the lead.

12. The compliant lead matrix of claim 11 wherein the leads of the matrix are shaped so that the ends of the leads extend parallel to the midportion of the leads with the ends being in alignment with and parallel to the midportion of the leads.

13. The compliant lead of claim 11 wherein the ends of each lead are in alignment with each other but the ends are not in alignment with the midportion of the lead.

14. The compliant lead matrix of claim 11 wherein there is a single intermediate portion encompassing the midpoint.

15. The compliant lead matrix of claim 12 wherein an intermediate portion is between the midpoint and each end of the lead.

16. A method of connecting an area grid array chip to a printed wire board comprising:

providing a compliant lead matrix including a carrier having a plurality of conductive leads extending through and secured relative to the carrier so that ends of the leads are exposed on each of first and second sides of the carrier, the leads being aligned in parallel with a longitudinal axis of the leads being perpendicular to a plane defined by the carrier, each lead having an intermediate portion exposed to at least one side of the carrier between the carrier and at least one of the ends of the lead, the intermediate portion not being in alignment with the longitudinal axis;

orienting the compliant lead matrix so that the ends of the leads exposed to the first side of the carrier are aligned with a matrix of conductive surface pads on the area grid array chip and in such proximity to the conductive surface pads on the chip as to permit electrical connection between the ends of the leads exposed to the first side of the carrier and the conductive surface pads on the chip;

electrically connecting the ends of the leads exposed to the first side of the carrier to the conductive surface pads of the area grid array chip;

orienting the compliant lead matrix so that the ends of the leads exposed to the second side of the carrier are aligned with conductive surface pads of the printed wire board and in such proximity to the conductive surface pads on the board as to permit electrical connection between the ends of the leads exposed to the second side of the carrier and the conductive surface pads on the board; and electrically connecting the ends of the leads exposed to the second side of the carrier to the conductive surfaces pads of the printed wire board thereby establishing an electrical connection between the area grid array chip and the printed wire board, and the intermediate portions of the leads being in a space between the carrier and the chip or board to which the one of the ends of the leads are connected.

17. A method of connecting an area grid array chip to a printed wire board comprising:

providing a compliant lead matrix including a carrier having a plurality of conductive leads extending through and secured relative to the carrier so that ends of the leads are exposed on each of first and second sides of the carrier, the leads being aligned in parallel with a longitudinal axis of the leads being perpendicular to a plane defined by the carrier, each lead having an intermediate portion exposed to at least one side of the carrier between the carrier and at least one of the ends of the lead;

orienting the carrier so that the ends of the leads exposed to the first side of the carrier are aligned with a matrix of conductive surface pads on the area grid array chip and in such proximity to the conductive surface pads on the chip as to permit electrical connection between the ends of the leads exposed to the first side of the carrier and the conductive surface pads on the chip;

electrically connecting the ends of the leads exposed to the first side of the carrier to the conductive surface pads of the area grid array chip;

orienting the carrier so that the ends of the leads exposed to the second side of the carrier are aligned with conductive surface pads of the printed wire board and in such proximity to the conductive surface pads on the board as to permit electrical connection between the ends of the leads exposed to the second side of the carrier and the conductive surface pads on the board; and electrically connecting the ends of the leads exposed to the second side of the carrier to the conductive surface pads of the printed wire board thereby establishing an electrical connection between the area grid array chip and the printed wire board; and removing the carrier to form a space between the chip and the board, the leads being compliant within the space to bend to relieve strain due to mechanical stress between the chip and the printed wire board.

18. The method of claim 17 wherein the carrier is removed by dissolving the carrier.

19. A method of securing a matrix of conductive leads to an area grid array chip having a connecting surface with a matrix of conductive surface pads comprising:

orienting the matrix including a plurality of conductive leads extending through and secured relative to one another by a carrier, the leads being aligned in parallel and being perpendicular to a plane defined by the carrier so that ends of the leads are aligned with the conductive surface pads on the area grid array chip and in such proximity to the conductive surface pads on the chip as to permit electrical connection between the ends of the leads and the conductive surface pads on the chip, each lead having an intermediate portion exposed to at least one side of the carrier between the carrier and a distal end of the lead, the intermediate portion not being in alignment with the ends of the lead; and electrically connecting the ends of the leads and the conductive surface pads of the area grid array chip.

20. An assembly comprising:

an area grid array semiconductor chip having a connecting surface with a matrix of conductive surface pads;

a printed wire board having a matrix of conductive surface pads; and a compliant lead matrix including
a carrier having first and second opposite sides, and
a plurality of compliant conductive leads each having a body extending through and secured relative to the carrier such that ends of the leads are exposed on each of the first and second sides of the carrier, the leads being aligned in parallel with a longitudinal axis of the leads being perpendicular to a plane defined by the carrier, the ends of the leads exposed on the first side of the carrier being attached to the surface pads of the chip and the ends of the leads exposed on the second side of the carrier being attached to the surface pads of the printed wire board, a portion of each lead body being exposed to at least one of the first and second sides of the carrier to position the respective end of the lead distal from the carrier to define a space between the carrier and the chip or board to which the respective end of the lead is connected, with the portion of the lead body extending through the space, the lead matrix mechanically and electrically connecting the chip to the printed wire board and the portion of each of the lead bodies being sufficiently compliant to displace radially from the respective longitudinal axis in the space to relieve strain due to mechanical stress between the chip and the printed wire board.

* * * * *